(12) United States Patent
Gleichauf

(10) Patent No.: US 11,742,260 B2
(45) Date of Patent: Aug. 29, 2023

(54) THREE-DIMENSIONAL DEVICE COOLING

(71) Applicant: Arm Limited, Cambridge (GB)

(72) Inventor: Paul Harry Gleichauf, Los Altos, CA (US)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 17/207,495

(22) Filed: Mar. 19, 2021

(65) Prior Publication Data

US 2022/0301978 A1 Sep. 22, 2022

(51) Int. Cl.
*H01L 23/467* (2006.01)
*H01L 25/065* (2023.01)
*H01L 25/00* (2006.01)
*H01L 21/48* (2006.01)

(52) U.S. Cl.
CPC ........ *H01L 23/467* (2013.01); *H01L 21/4882* (2013.01); *H01L 25/0657* (2013.01); *H01L 25/50* (2013.01); *H01L 2225/06541* (2013.01); *H01L 2225/06589* (2013.01)

(58) Field of Classification Search
CPC ..................................................... H01L 23/467
See application file for complete search history.

(56) References Cited

U.S. PATENT DOCUMENTS

| | | | |
|---|---|---|---|
| 5,838,060 A * | 11/1998 | Comer | H01L 23/49827 257/665 |
| 7,019,967 B2 * | 3/2006 | DiFonzo | G06F 1/1662 174/544 |
| 11,300,740 B1 * | 4/2022 | Park | G02B 6/4212 |
| 2021/0125899 A1 * | 4/2021 | Bitz | H01L 25/0657 |
| 2021/0267043 A1 * | 8/2021 | Yoo | H05K 1/0206 |
| 2021/0272930 A1 * | 9/2021 | Choi | H01L 25/0652 |
| 2022/0208745 A1 * | 6/2022 | Koduri | H01L 23/49838 |
| 2022/0278021 A1 * | 9/2022 | Nootens | H01L 21/4857 |

* cited by examiner

*Primary Examiner* — Thao P Le
(74) *Attorney, Agent, or Firm* — Berkeley Law & Technology Group, LLP

(57) ABSTRACT

Subject matter disclosed herein may relate to devices and techniques for cooling three-dimensional integrated circuit (IC) devices. In particular embodiments, an IC device may comprise a three-dimensional structure having a first surface adapted to face a mounting surface and a second surface opposite the first surface, and having one or more cavities to extend at least below the second surface.

12 Claims, 11 Drawing Sheets

THREE-DIMENSIONAL DEVICE COOLING

BACKGROUND

Field

This disclosure relates to devices and techniques for thermal management of integrated circuit (IC) devices.

Information

Technologies to cool IC devices in operation have included active and passive cooling techniques. Passive techniques to cool IC devices may complement external device features adapted to natural airflow and/or use of conductive heat sinks to facilitate removal of heat. Active techniques to cool IC devices may further include use of fans or refrigeration (e.g., in combination with passive techniques) to remove heat at a higher rate. As IC devices leverage smaller circuit geometries enabled by newer processing techniques, IC dies tend to generate more heat per unit volume. Additionally, formation of IC dies as three-dimensional devices (e.g., by integrating multiple circuit layers) may tend to decrease surface area to volume of IC dies, further complicating removal of heat from IC devices using active or passive techniques.

BRIEF DESCRIPTION OF THE DRAWINGS

Claimed subject matter is particularly pointed out and distinctly claimed in the concluding portion of the specification. However, both as to organization and/or method of operation, together with objects, features, and/or advantages thereof, it may best be understood by reference to the following detailed description if read with the accompanying drawings in which:

Figure 1:
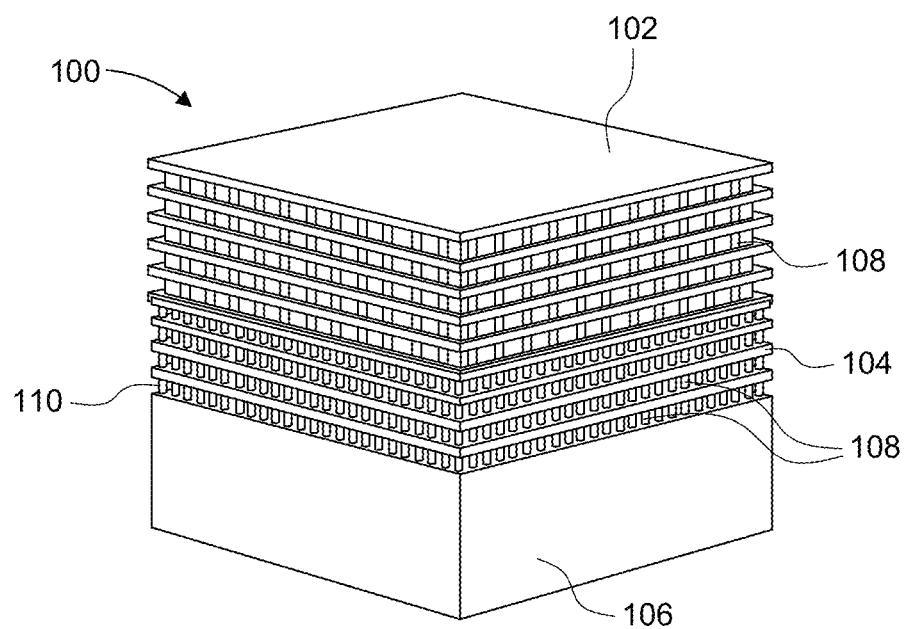
FIG. 1 is a schematic diagram of a three-dimensional integrated circuit (IC) die according to an embodiment.

Reference is made in the following detailed description to accompanying drawings, which form a part hereof, wherein like numerals may designate like parts throughout that are corresponding and/or analogous. It will be appreciated that the figures have not necessarily been drawn to scale, such as for simplicity and/or clarity of illustration. For example, dimensions of some aspects may be exaggerated relative to others. Further, it is to be understood that other embodiments may be utilized. Furthermore, structural and/or other changes may be made without departing from claimed subject matter. References throughout this specification to "claimed subject matter" refer to subject matter intended to be covered by one or more claims, or any portion thereof, and are not necessarily intended to refer to a complete claim set, to a particular combination of claim sets (e.g., method claims, apparatus claims, etc.), or to a particular claim. It should also be noted that directions and/or references, for example, such as up, down, top, bottom, and so on, may be used to facilitate discussion of drawings and are not intended to restrict application of claimed subject matter. Therefore, the following detailed description is not to be taken to limit claimed subject matter and/or equivalents.

DETAILED DESCRIPTION

References throughout this specification to one implementation, an implementation, one embodiment, an embodiment, and/or the like indicates that a particular feature, structure, characteristic, and/or the like described in relation to a particular implementation and/or embodiment is included in at least one implementation and/or embodiment of claimed subject matter. Thus, appearances of such phrases, for example, in various places throughout this specification are not necessarily intended to refer to the same implementation and/or embodiment or to any one particular implementation and/or embodiment. Furthermore, it is to be understood that particular features, structures, characteristics, and/or the like described are capable of being combined in various ways in one or more implementations and/or embodiments and, therefore, are within intended claim scope. In general, of course, as has been the case for the specification of a patent application, these and other issues have a potential to vary in a particular context of usage. In other words, throughout the disclosure, particular context of description and/or usage provides helpful guidance regarding reasonable inferences to be drawn; however, likewise, "in this context" in general without further qualification refers to the context of the present disclosure.

According an embodiment, designs of integrated circuit (IC) devices may be optimized to achieve a combination of goals including low power consumption, computational performance and reduced physical area. In a particular implementation, exposed surface area of an IC device may be increased by deliberately adding connected voids extending through multiple circuit layers of a multi-circuit layer IC device to enhance cooling, and thereby further facilitate lower power consumption and computational performance. In another particular implementation, a set of complementary cooling circuits at varying length scales may be integrated with heat-producing electrical circuits.

A three-dimensional integrated circuit (IC) device may comprise a three-dimensional circuit die comprising multiple circuit layers to collectively perform one or more functions (e.g., general computing, graphics, sensing, communication, system on a chip (SoC), etc.). In an embodiment, a three-dimensional circuit die may comprise metal vias connecting different layers to, for example, provide power to and/or facilitate communication among different circuit layers. Also, different layers of a three-dimensional IC device may have specialized functions such as, for example, computing, storage and/or inter-device communication, just to provide a few examples. In a particular implementation, a layer specialized for computing may comprise processing circuitry such as, for example, multiple core processors where a core processor includes an arithmetic logic unit (ALU), registers and/or a bus interface. Similarly, a layer specialized for storage may comprise volatile and/or non-volatile bitcell circuitry coupled with controller circuitry to facilitate read and/or write operations. Likewise, a layer specialized for inter-device communication may comprise signal processing and/or conditioning circuitry adapted for communication in a physical medium. It should be understood, however, that these are merely examples of specialized circuitry that may be formed on circuit layers of a three-dimensional IC die, and claimed subject matter in not limited in this respect.

In a particular implementation, different circuit layers of a three-dimensional IC die specialized for different particular functions may not generate heat uniformly from one circuit layer to the next. For example, one circuit layer of a three-dimensional IC die comprising predominately processing cores (e.g., specialized for computing) may generate heat at a substantially higher rate than another circuit layer comprising predominately non-volatile and/or volatile memory bitcells (e.g., specialized for storage). As process innovation enables a higher level of circuit integration on different circuit layers of a three-dimensional IC device, currently available active and passive cooling techniques may not be capable of cost effectively managing heat generated by such IC devices with a higher level of circuit integration.

According to an embodiment, an IC device may comprise: a three-dimensional structure having a first surface adapted to face a mounting surface and a second surface opposite the first surface. The three-dimensional structure further to comprise one or more cavities to extend between the first surface and the second surface to discharge heat from the second surface.

In an example embodiment, a three-dimensional IC die having a cube shape may comprise external surfaces comprising six planar peripheral surfaces. In a particular implementation, one or more cavities may be formed in a three-dimensional IC die to improve air circulation enabling removal of heat at a higher rate. Here, exposed surface area of the cavities combined with area of peripheral surfaces may provide an increase in overall surface area to exchange heat with surrounding air. This may enable an increased airflow and efficiency in cooling such a three-dimensional IC die using active or passive cooling techniques. Furthermore, a cavity formed in three-dimensional channel may provide additional opportunities to localize particular higher-heat generating circuitry (e.g., core processors for computing) in a three-dimensional IC die to be adjacent to exterior surfaces (e.g., "edges" of a three-dimensional IC die), enabling further efficiencies to removal of heat using active and/or passive cooling techniques. In an embodiment, a cavity extending through a three-dimensional IC die may draw cooler air into the three-dimensional IC die and discharge warmer air out of the three-dimensional IC die. Additionally, particular implementations are directed to increasing heat flow out of a core (e.g., center) of a three-dimensional IC die by increasing overall exposed surface area, both on exterior surfaces and on cavities formed in the three-dimensional IC die. In an implementation, some computational circuitry in such a three-dimensional IC die may be positioned to be nearer an exterior surface, but also nearer to cavities and/or connecting chimneys.

FIG. 1 is a schematic diagram of an IC die 100 comprising multiple circuit layers with specialized circuitry according to an embodiment. One or more layers of logic circuitry 106 may be disposed over a mounting surface and/or substrate (not shown), which may in turn be coupled to a heat sink (not shown) enabling removal of heat using active and/or passive techniques. One or more layers of high-speed non-volatile memory circuitry 104 may be disposed over layer(s) of logic circuitry 106, and one or more layers of high-density non-volatile memory circuitry 102 may be disposed over layer(s) of high-speed non-volatile memory circuitry 104. Metal vias 108 may extend between and/or across layer(s) of logic circuitry 106, layer(s) of high-speed non-volatile memory circuitry 104 and/or layer(s) of high-density non-volatile memory circuitry 102 to enable communication between and/or among layers, and distribution of power and/or clock signals, for example.

According to an embodiment, an interposer layer 110 is shown to be disposed between a circuit layer of logic circuitry 106 and an adjacent circuit layer of high-speed non-volatile memory circuitry 104, and may comprise a solid material or a fluid (e.g., air, water, Freon® and/or other fluid coolant/refrigerant). In other particular implementations, an interposer layer may be disposed between different adjacent circuit layers of IC die 100, and claimed subject matter is not limited in this respect. IC die 100 is shown to have six planar peripheral surfaces. In a particular implementation in which interposer layer 110 comprises air, interposer layer 110 may enable exposure of additional surfaces for heat removal. Unfortunately, depending on a particular width of interposer layer 110 comprising a fluid such as air, a presence of eddies in interposer layer 110 may impede and/or limit air flow through interposer layer 110, thus limiting an ability to remove heat from surfaces of adjacent layers exposed to interposer layer 110.

According to an embodiment, three-dimensional IC die 200 may be fabricated using any one of several available processing techniques including, for example, material deposition (e.g., sputter deposition, chemical vapor deposition and/or physical vapor deposition). Cavities 202 and 204 may be formed, for example, by a series of steps involving layer deposition, masking (e.g., using available lithography techniques) and etching. Metal vias connecting layers (e.g., to distribute power and/or clock signal) may be similarly formed by masking, etching and filing using metal deposition techniques. In an embodiment in which an electrically conductive coolant is to flow in cavities 202 and/or 204, cavities 202 and/or 204 may be electrically (but generally not thermally) insulated to protect the electronic circuits and conductive vias from fluid damage and/or electrical short circuits. In some applications, a liquid condensate may form on surfaces of cavities 202 and/or 204 (e.g., if air with humidity is used as a cooling fluid). Such condensate may enable small dust particles to collect and ultimately obstruct cavities 202 and/or 204. In a particular implementation, cavities 202 and/or 204 may be lined with a hydrophobic coating to enable liquid condensate to move and be displaced so as to inhibit such collection of dust particles in cavities 202 and/or 204 and avoid obstructions.

Figure 2A:
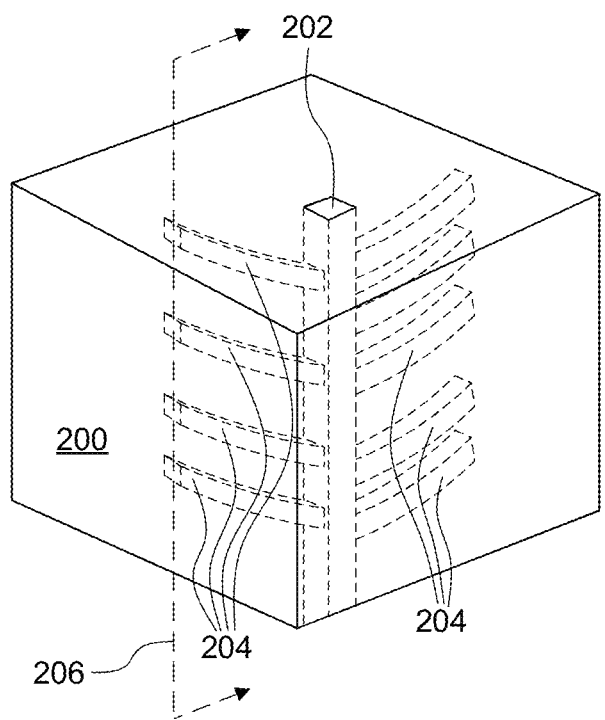
FIG. 2A is a schematic diagram of a three-dimensional IC die comprising cavities to extend between layers according to an embodiment.

FIG. 2A is a schematic diagram of a three-dimensional IC die 200 comprising cavities to extend between circuit layers according to an embodiment. According to an embodiment, three-dimensional IC die 200 may comprise cavities 202 and 204 to increase a flow of fluid (e.g., air or liquid coolant) circulation to surfaces of three-dimensional IC die 200 to thereby enable efficient removal of heat from three-dimensional IC die 200. In the particular illustrated implementation, cavity 202 may be approximately entered on an axis of three-dimensional IC die 200, and extend vertically an entire length of three-dimensional IC die 200 to permit warmer air to pass upward in a chimney-like fashion to discharge heat and cooler denser air to sink downward (when gravity is present). Additionally, cavities 204 may provide branch channels that are connected to cavity 202 to further facilitate transportation and/or removal of heat (e.g., removal of heat from IC die 200 and/or transportation of heat to a cooler portion of IC die 200). While in an embodiment, three-dimensional IC die 200 is shown to have a single cavity 202 extending an entire vertical length of three-dimensional IC die 200, it should be understood that other implementations may include multiple such cavities extending an entire length of a three-dimensional IC die to enable an increased level of heat discharge.

According to an embodiment, three-dimensional IC die 200 may be formed, at least in part, by depositing layers of material to form individual circuit layers connected by metal vias (not shown). In an embodiment, material to form individual circuit layers may comprise, for example, materials suitable to form CMOS devices and metal to provide interconnects between and/or among such CMOS devices. Cavities 202 and branch channels 204 may be formed by selective masking and etching individual circuit layers. Such etching processes may include any one of several etching processes such as, for example, ion beam etching, plasma etching and/or chemical etching.

Figure 2B:
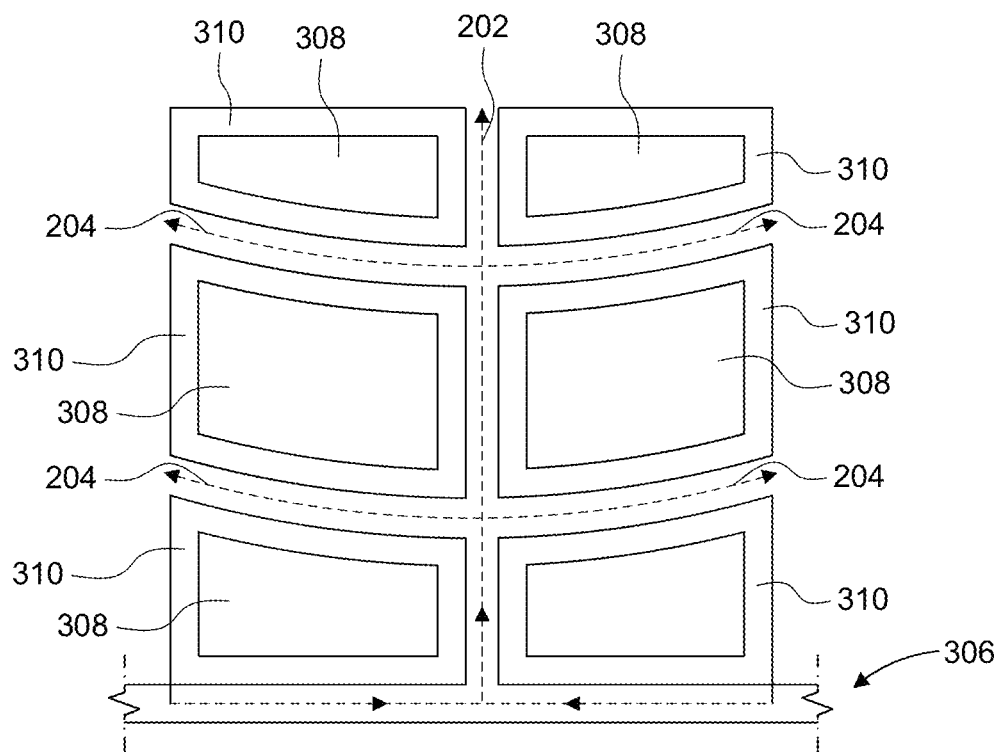
FIG. 2B is a cross-section diagram of a portion of a three-dimensional IC die according to an embodiment.

FIG. 2B is a cross-section diagram of a portion of a three-dimensional IC die according to an embodiment. According to an embodiment, FIG. 2B is a cross-section diagram of three-dimensional IC die 200 in a plane defined by indicator 206. As shown, air may be drawn underneath three-dimensional IC die 200 in a gap 306. Air drawn in gap 306 may circulate through cavity 202 and/or branch channels 204 to carry and discharge heat generated by operation of circuits of cross-section diagram of three-dimensional IC die 200. In an embodiment, air drawn in gap 306 may be cooler air (e.g., cooled from active and/or passive cooling structures). As pointed out above, circuitry formed in three-dimensional IC die 200 may be adapted to perform different specialized functions such as computing, storage and/or inter-device communication.

In the particular embodiment shown in FIGS. 2A and 2B, cavities 204 are depicted as having relatively smooth surfaces extending from cavity 202 to exterior portions of IC die 200. Portions of circuit layers may be etched (e.g., chemical and/or ion etch) to form voids that enable cavities 204 to pass through. In an implementation, circuit layers of IC die 200 may be separated by interposer layers (e.g., polymer or other insulating interposer layers, not shown) while metal vias may pass through the interposer layers to connect circuit layers. Material in such interposer layers formed between circuit layers may be removed to connect voids formed in circuit layers to enable relatively smooth contour surfaces of cavities 204. Alternatively, in the absence of such interposer layers, etched voids in adjacent circuit layers may overlap to form a cavities extending from a central cavity to a side surface.

According to an embodiment, individual component layers may not be specific dedicated to circuitry to implement a single function (e.g., single function as processing or storage). As may be observed, circuit portions 310 are on a periphery of three-dimensional IC die 200 or adjacent to cavity 202 and/or cavity 204. Conversely, circuit portions circuit portions 308 may be formed in a more interior region surrounded/enveloped by circuit portions 310. In a particular implementation, circuit portions 310 may comprise circuitry specialized for computing (e.g., generating heat per unit volume at a relatively high rate) while circuit portions 308 may comprise circuitry specialized for storage (e.g., generating heat per unit volume at a relatively lower rate). Placement of such higher-heat-generating circuitry adjacent to a periphery of three-dimensional IC die 200 and/or adjacent to cavity 202 and/or cavity 204 may enable greater efficiencies in removal of heat from three-dimensional IC die 200.

Figure 3A:
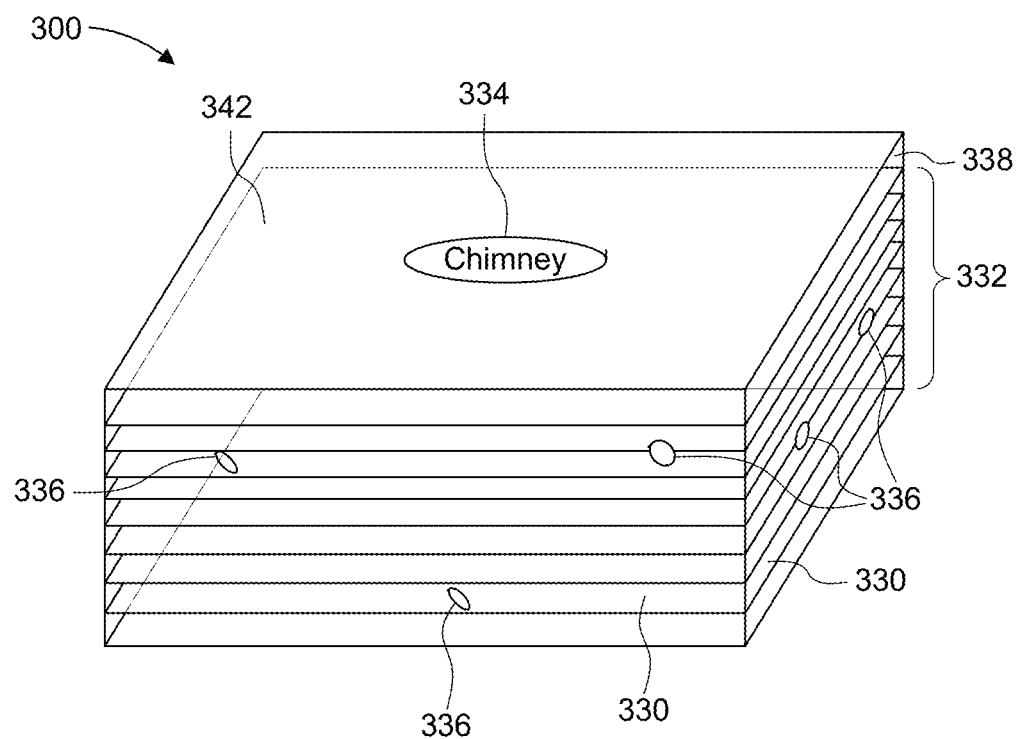
FIGS. 3A, 3B and 3C are diagrams of a three-dimensional device according to an alternative embodiment.
Figure 3B:
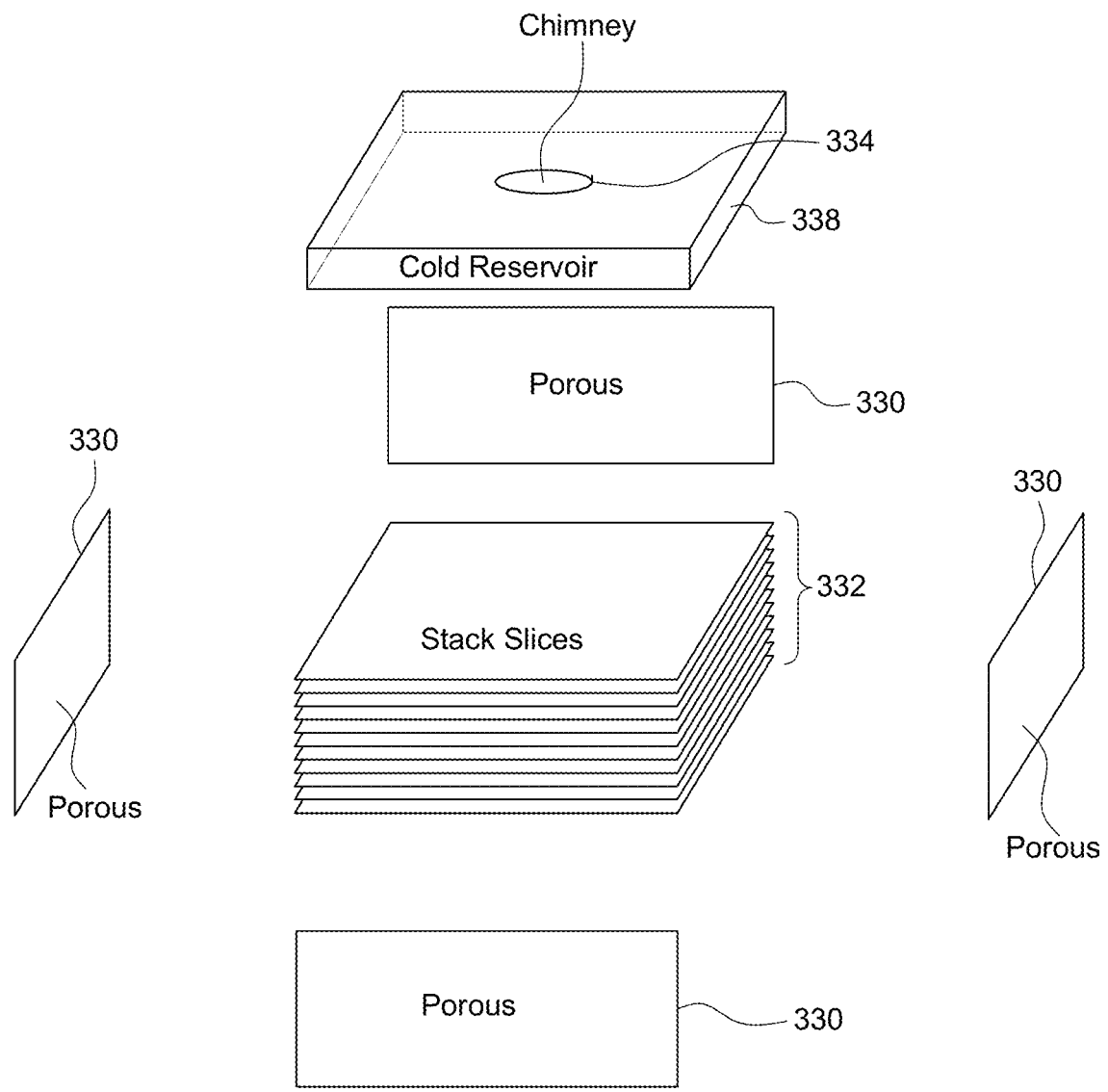
Figure 3C:
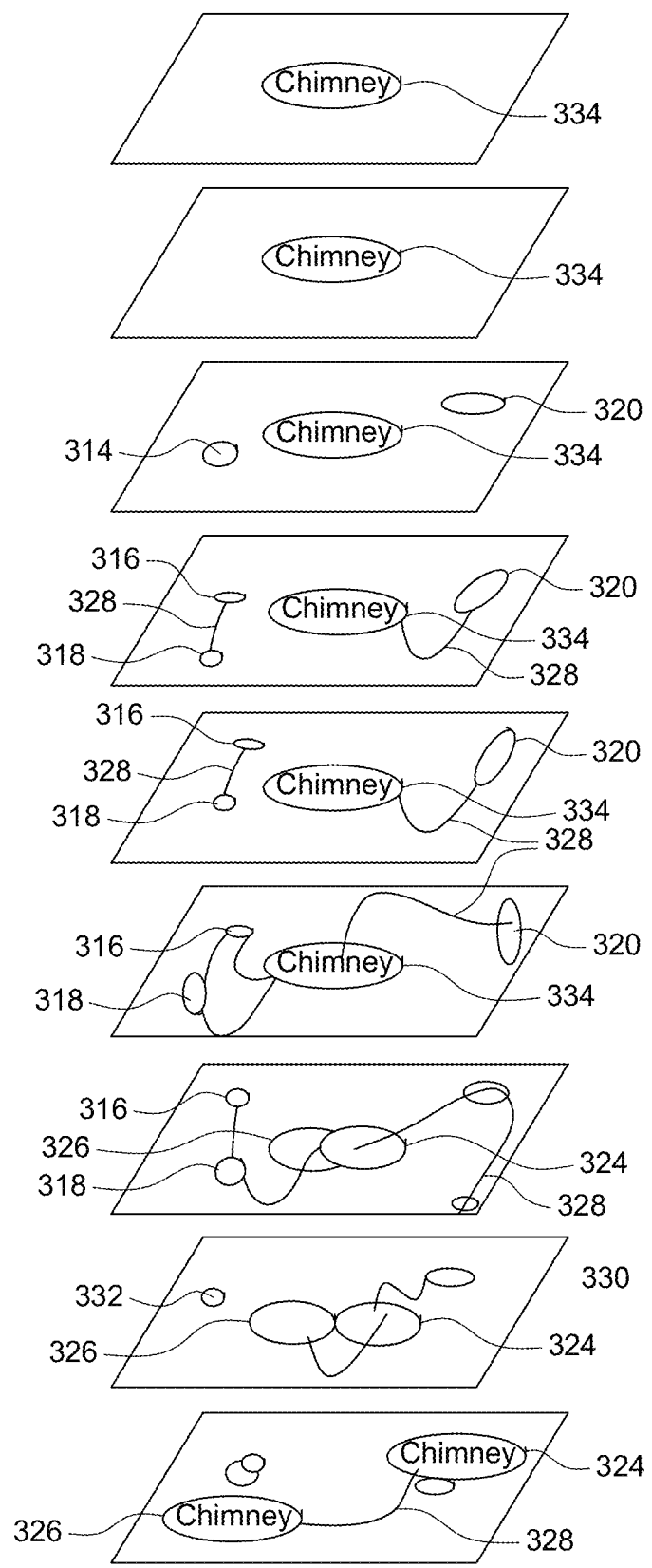

FIGS. 3A through 3C are diagrams showing features of an alternative embodiment in which multiple cavities formed in a three dimensional IC device may merge with and/or combine to create an ascending central cavity 334. A processing structure 300 may comprise multiple circuit layers 332. In an embodiment, particular circuit layers 332 may not be dedicated solely to circuitry to implement a single function such as processing or storage, and may include circuitry dedicated to a mixture of such functions. For example, a particular circuit layer may position circuitry that generates heat at a high rate (e.g., processing circuitry) adjacent to peripheral surfaces and/or cavities formed in processing structure 300 (e.g., adjacent to central cavity 334). The specific examples described herein are directed to formation of circuit layers 332 as being formed in a three-dimensional IC device. It should be understood, however, that similar features and/or principles may apply if circuit layers 332 are to be formed as individual modular processing boards maintained in a computing rack.

In the illustrated implementation, a central cavity 334 may extend through circuit layers 332 and a cold reservoir 338 to act as a "chimney" to draw cooler air from cold reservoir 338 and discharge warmer air through the chimney. Cold reservoir 338 may comprise, for example, a heat sink that may be additionally be coupled to a liquid cooling system (not shown). In the case of a rack enclosure of boards a cooling reservoir may also be located at the bottom. Additional branch channels 336 extending through lateral surfaces 330 may be connected to central cavity 334 to further facilitate discharge heat from interior portions of processing structure 300. Additionally, lateral surfaces 330 may be formed of porous material, enabling heat from devices closest to a periphery of processing structure 300 to be discharged. Such porous materials may comprise, for example, texture paints, porous aluminum, coated metal fins, sintered metals or even Gore-Tex®-like membrane materials, just to provide a few examples. In this context, a "porous material" as referred to herein means a material having a non-smooth surface (e.g., textured) that may or may not allow fluid to flow therethrough. In particular implementations, such a porous surface may provide an increased effective exposed surface area over that of a smooth surface, which may enable a more efficient exchange of heat. According to an embodiment, air channels and interior surfaces may be lined with a material that is thermally conductive but electrically insulative, such as specially prepared graphene, for example.

According to an embodiment as shown in FIG. 3C, smaller cavities may converge to create and/or to combine with central cavity 334 to facilitate discharge of heat from peripheral portions of processing structure 300. For example, cavities 316 and 318 in lower circuit layers 332 may combine to form cavity 314 at a higher circuit layer 332, which in turn combines with central cavity 334 at an even higher layer circuit layer 332. Similarly, cavities 324 and 326 ascend from lowest circuit layers 332 and converge to form central cavity 334 at highest circuit layers 332. In an embodiment, convergence of cavities 316, 318, 324 and 326 to form central cavity 334 may implement a tapering that optimizes upward airflow (e.g., according to a computational fluid dynamics-based cost model). For example, conical dimensions of cavities 316, 318, 324, 326 and 334 may contribute to an internal resonance optimized for upward airflow. According to an embodiment, smaller channels 328 provide "capillaries" that may enable diffusion and/or convection (e.g., where vertical) of heat, but may be not large enough to force large volumes of rapidly moving fluid (air) because of turbulence. This is especially important near a porous exterior (e.g., lateral surfaces 330) where "pores" may enhance and/or enable heat exchange regardless of whether there is fluid to enable an evaporative cooling effect.

According to an embodiment, cavities 202 (FIGS. 2A and 2B), cavities 204 (FIGS. 2A and 2B) and 334 (FIGS. 3A, 3B and 3C) may be dimensioned to provide a resonance matching airflow internal to a three-dimensional structure and an airflow external to the three-dimensional structure. Additionally, cavities 202 and 334 may induce a pumping action and/or a thermo-siphon to draw cooler air from below circuit layers (e.g., from gap 306) and discharge air that has been warmed by heat exchange with interior surfaces (warmed by circuit operation).

Figure 3D:
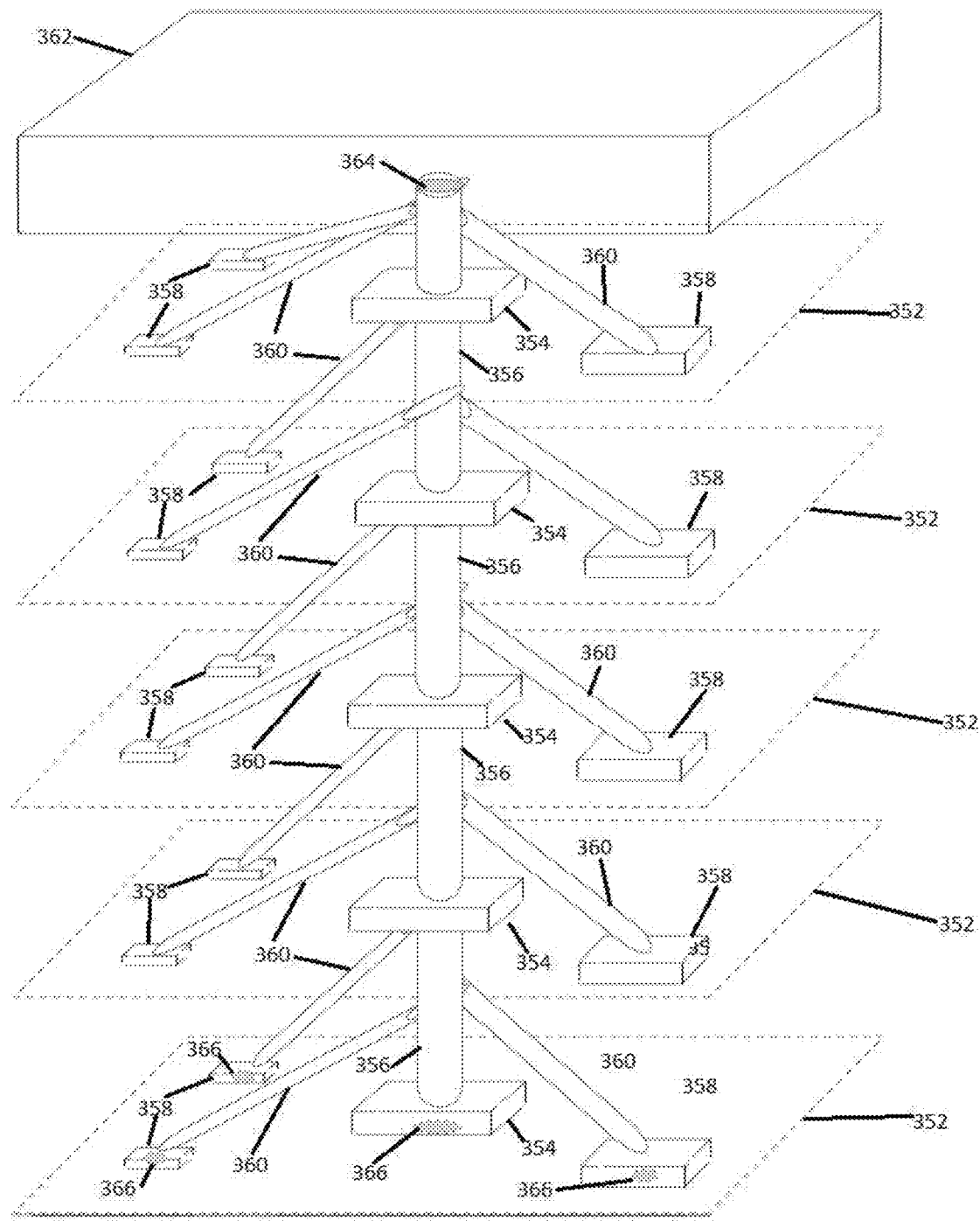
FIGS. 3D and 3E are diagrams of illustrating features of a cooling system implemented in a computing rack comprising modular circuit boards, according to alternative embodiments.
Figure 3E:
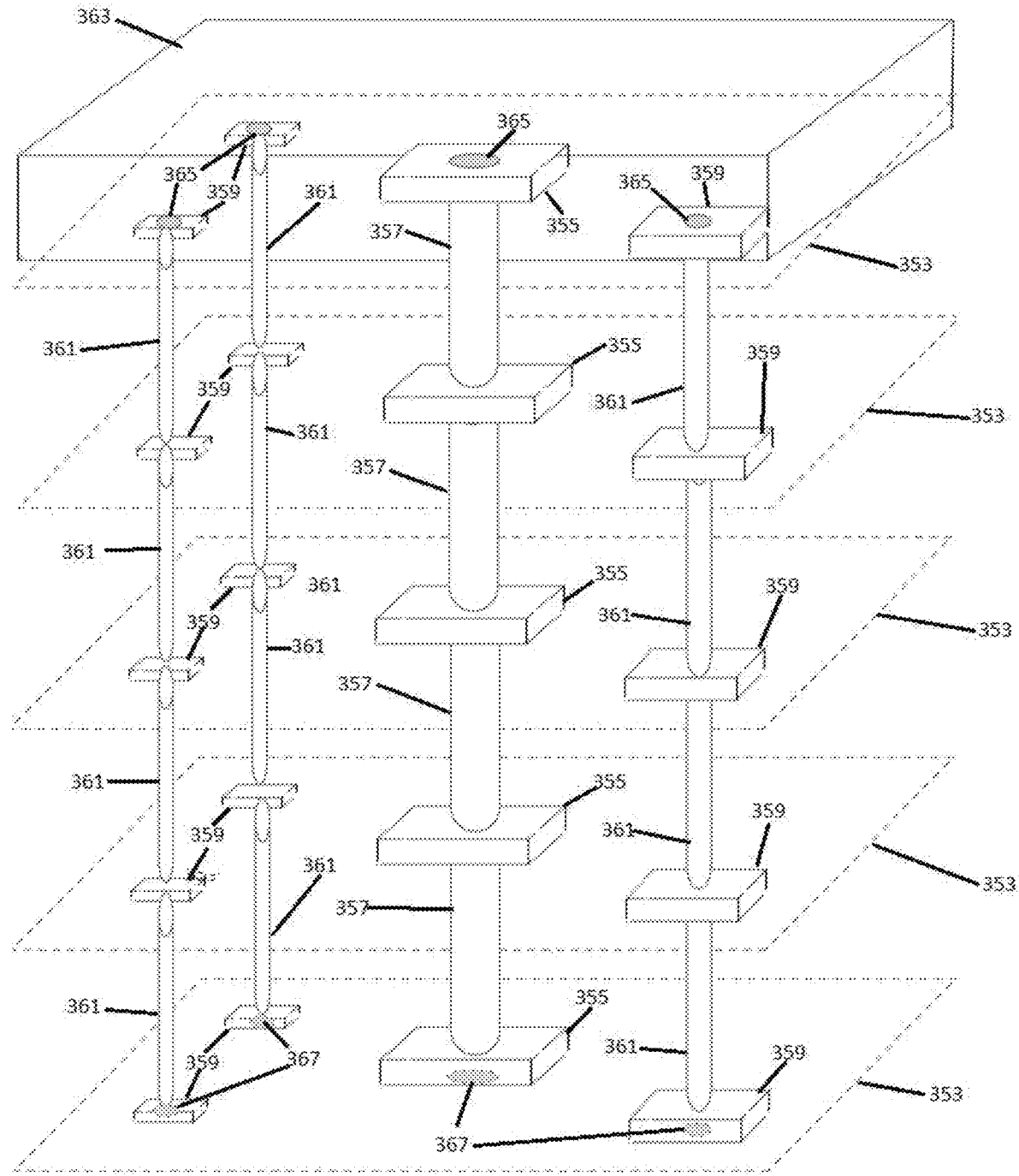

FIGS. 3D and 3E are diagrams illustrating features of a cooling system implemented in a computing rack comprising modular circuit boards, according to alternative embodiments. Modular circuit boards 352 and 353 may be mounted in mechanical racks (not shown) to support circuit boards 352 and 353 within enclosures (not shown). Such enclosures may include porous sides to enable efficient Electrical backplanes (not shown) may be used to electrically couple to circuit boards 352 and 353 to larger systems. Fans and/or other active cooling devices (not shown) may also be used to circulate cool air over circuit boards 352 and 353 to remove heat generated by mounted three-dimensional IC devices mounted on circuit boards 353 and 353.

According to a particular implementation, three-dimensional IC devices 354 and 355 may have a cooling structure similar to that of processing structure 300 (FIG. 3A). Air cavities 356 may be disposed between three-dimensional IC devices 354 forming a "chimney" to draw warm air toward cooling plate 362 and through aperture 364 with apertures 366 to receive air. Similarly, air cavities 357 may be disposed between three-dimensional IC devices 356 forming a "chimney" to draw air toward coiling plate 363 through aperture 365 with apertures 367 to receive air.

Also, three-dimensional IC devices 358 and 359 may have a cooling structure similar to that of processing structure 300. Three-dimensional ICs 358 may be coupled to air cavities 356 to draw fluid (e.g., air) through aperture 364 by cavities 360 to cool circuits formed in three-dimensional ICs 358. In the particular implementation of FIG. 3E, modular circuit boards 353 may be formed with the same components and layout such that corresponding IC devices 359 on different circuit boards 353 are vertically aligned if circuit boards 353 are installed in a mechanical rack. Such vertically aligned IC devices 359 may be coupled by cavities 361 to forming "chimneys" to draw air toward cooling plate 363 and through apertures 365.

Figure 4:
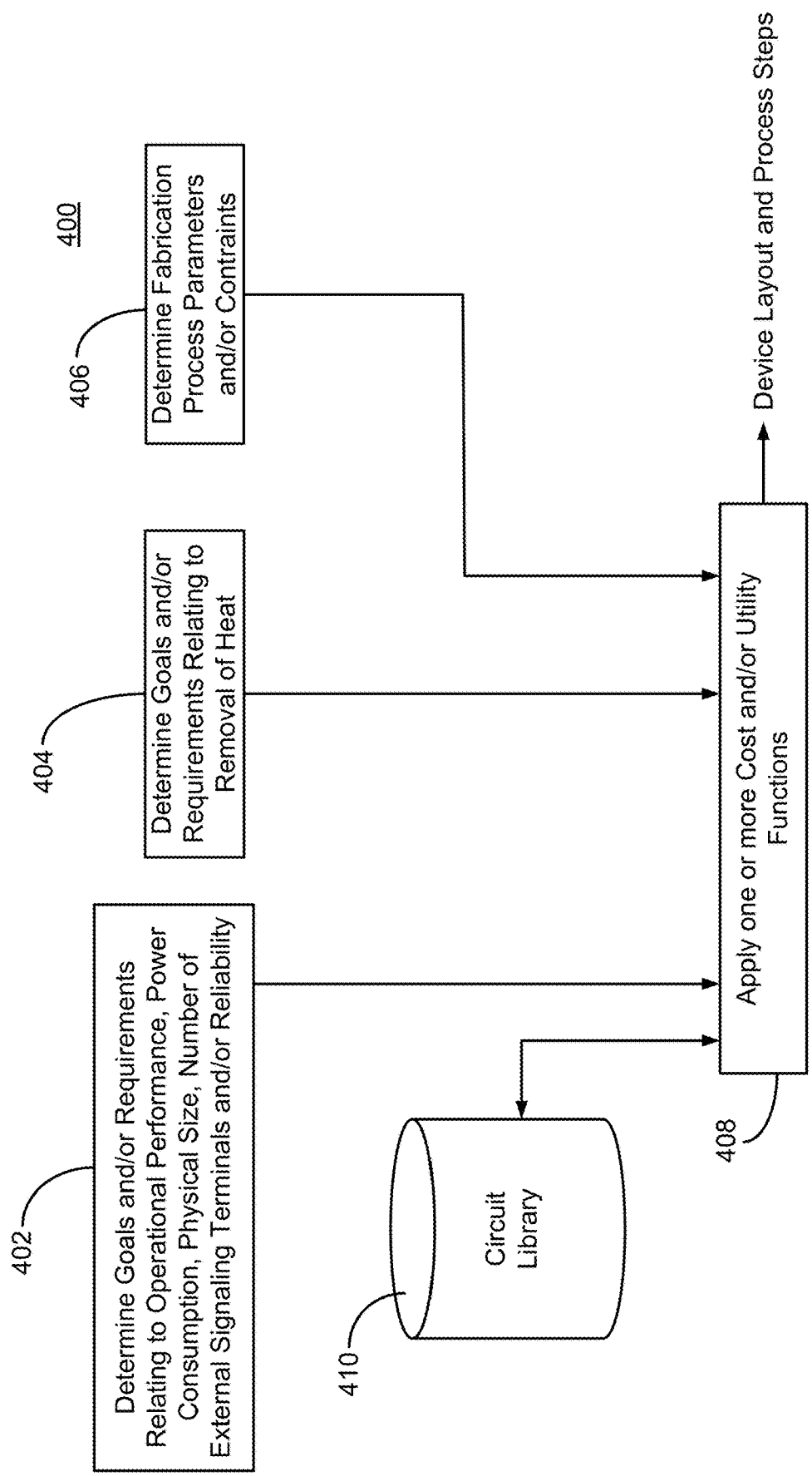
FIG. 4 is a flow diagram illustrating a process of determining features of a three-dimensional IC device according to an embodiment.

FIG. 4 is a flow diagram illustrating a process 400 of determining features of a three-dimensional IC die (e.g., such as three-dimensional IC die 200 or three-dimensional IC die 300) according to an embodiment. In the discussion of FIGS. 2A, 2B, 3A, 3B, 3C, 3D and 3E, features of an IC device may be optimized for a given set of operating parameters that are fixed or are defined over ranges. For example, a particular design feature may necessarily be optimized for a single, fixed set of conditions, but rather a range of expected operational conditions. In one aspect as discussed below, a particular static design may be dynamically "tuned" in operation so as to optimize cooling responsive to fluctuating workloads.

In a particular implementation, process 400 may determine features of a three-dimensional IC die based, at least in part, on particular goals and/or requirements to include, for example, power, operational performance, power consumption, physical size, number of external signaling terminals (e.g., "pins") and/or reliability, just to provide a few examples. Goals and/or requirements applicable to operational performance may be characterized and/or specified, for example, based on memory storage capacity (e.g., for high-speed non-volatile memory and/or high-density non-volatile memory), memory operation latencies, number of computing cores, latency of communication between computing cores and/or latency in communication with other IC devices. Alternatively, goals and/or requirements applicable to operational performance may be characterized and/or specified as an expected operational/runtime performance in executing one or more benchmark applications, tasks and/or operations. According to an embodiment, a cost and/or utility function may be determined over a dataset representing typical workloads and/or simulations of hardware events. It should be understood, however, that these are merely examples of how operational performance may be characterized and/or specified in connection with a cost and/or utility function, and claimed subject matter is not limited in this respect.

Additionally, process 400 may determine features of such a three-dimensional IC die based, at least in part, on goals and/or requirements relating to removal of heat (e.g., quantified as joules per second). As pointed out above, heat may be removed from portions of a three-dimensional IC die passively and/or actively. To determine features based, at least in part, on goals and/or requirements relating to removal of heat, process 400 may determine features relating to cavities to extend below surfaces of a three-dimensional IC device (e.g., to increase exposed surface area over exposed peripheral surfaces). For example, process 400 may specify a particular location and/or size of a central cavity (e.g., cavity 334 extending through top surface 342 to draw cool air from cold reservoir 338 and discharge warmer air through top surface 342). Additionally, process 400 may determine features relating to branch channels (e.g., branch channels formed by cavities 204) to extend from a central cavity (e.g., cavity 202) to an external surface of a three-dimensional structure. For example, process 400 may determine a number, size and placement of such branch channels.

Block 402 may comprise, for example, defining particular constraints and/or objective metrics of a three-dimensional IC die as identified by non-limiting example above. Block 402 may, for example, define minimum and/or maximum values for parameters to be specified for goals and/or requirements relating to operational performance, power consumption, physical size, number of external signaling terminals and/or reliability. For operational performance, for example, block 402 may specify a number of core processors of a specific design, quantities of volatile and/or non-volatile memory, and/or expected performance of a finished device in one or more benchmark applications, tasks and/or operations. For power consumption, for example, block 402 may specify a maximum power consumption for specific modes of operation (e.g., at full power, sleep, etc.). For physical size, block 402 may specify a maximum number of layers and/or maximum surface area footprint to be coupled to a mounting device. For reliability, block 402 may determine an expected operational life before failure. Block 404 may comprise, for example, defining a minimum rate of heat removal and/or a maximum operational temperature (e.g., at full power operation). Block 406 may comprise, for example, defining parameters of an available process for manufacturing a three-dimensional IC die to include, for example, transistor size, materials (e.g., any dopants or metal for conductive vias, etc.), lithography parameters and/or available etching techniques deposition parameters, annealing parameters, just to provide a few examples of parameters to define an available process for manufacturing of a three-dimensional IC die. In a particular implementation, parameters defined in block 406 may be determined based, at least in part, on capabilities of one or more candidate fabrication facilities that may be employed in manufacturing a three-dimensional IC die. Similarly, available circuitry defined in circuit library 410 that may be implemented may be based on capabilities of the one or more candidate fabrication facilities and intellectual property available circuit library 410.

Block 408 may comprise application of one or more cost and/or utility functions to determine a device layout and/or process steps for manufacturing a three-dimensional IC die according to parameters specified and/or defined in blocks 402, 404 and/or 406. Such a cost and/or utility function may determine particular parameters to define, for example, features and/or parameters of a device layout and/or processing steps to be employed in fabricating a three-dimensional IC device. Such a layout may be expressed, at least in part, according to a hardware description language (HDL) such as, for example, Verilog or VHDL, based on high-level representations of a circuit (e.g., expressing circuitry available in circuit library 410). For example, block 408 may execute mathematical programming and/or optimization to maximize or minimize (e.g., subject to goals and/or requirements set forth in blocks 402 and 404) a cost and/or utility function.

In one particular example, block 402 may specify particular minimum requirements for operational performance, maximum for power consumption, maximum physical size dimensions and minimum reliability requirements to be constraints of one or more cost and/or utility functions. Fabrication process parameters and/or constraints determined at block 406 may specify additional constraints for such a cost and/or utility function. Block 408 may then, subject to constraints of such a utility model specified at blocks 402 and 406, determine a layout for a three-dimensional IC die (e.g., based, at least in part, on circuit modules available in circuit library 410) and process steps that are to maximize removal of heat in operation.

In another particular example, block 404 may specify particular minimum requirements relating to removal of heat to be a constraint for a cost and/or utility function. Likewise, a maximum for power consumption, maximum physical size dimensions and minimum reliability requirements defined at block 402, and fabrication process parameters and/or constraints determined at block 406 may specify additional constraints for such a cost and/or utility model. Block 408 may then, subject to such constraints defined in blocks 402, 404 and 406, determine a layout for a three-dimensional IC die and/or process steps that is to maximize one or more attributes of operational performance.

In an embodiment, block 408 may determine physical placement of different circuitry types on particular circuit layers of a three-dimensional IC die based, at least in part, on a proximity to exterior surfaces (e.g., an exterior surface of a cavity or branch channel, and/or peripheral exterior surface) where there is to be air flow or other cooling device (e.g., heat sink). In particular implementations, a heat sink and porous "skin" (e.g., lateral surfaces 330) may provide "passive" elements of a cooling system for an IC device while a cold reservoir may introduce an "active" element of such a cooling system. In an example, a cooling system to transport a cooling fluid in a convective matter (e.g., employing gravity) may be a passive technique while use of a pump to transport a cooling fluid (e.g., in zero gravity and/or different orientations) may be an active technique.

As discussed above, for example, block 408 may determine placement of higher heat-generating circuitry (e.g., for core processors) on a particular circuit layer of a three-dimensional IC die to be adjacent to such an exterior surface to enable efficient removal of heat. Conversely, block 408 may determine placement of lower heat-generating circuitry (e.g., volatile and/or non-volatile bitcells) on such a particular circuit layer of the three dimensional IC to be interior from such external surfaces. In a particular embodiment in which block 408 may place core processor circuitry (high heat-generating) adjacent to exterior surfaces and storage circuitry (low heat-generating circuitry), block 408 may balance utility of operational performance and utility of heat removal. For example, block 408 may balance a utility of heat removal with a cost associated with latencies in memory access times and/or latencies in inter-core processor communication (e.g., arising from placement of devices that communicate), for example. In an example implementation, block 408 may place circuitry specialized for computing on a periphery of three-dimensional IC die, or adjacent to cavity and/or a branch channel (e.g., placement of computing circuitry in circuit portions 310 as shown in FIG. 2B) to enable efficiencies in removal of heat.

In particular implementations as described herein, an IC layout may be tailored to facilitate cooling based on a static design (e.g., a static availability of cooling resources). Such a static design may be based on a simulation of likely/typical workloads and/or component power demands to satisfy such workloads. For example, averaging cooling requirements or tracking peak loads may decrease a likelihood that an IC device overheats, stops functioning correctly and/or self-destructs. This may produce a static design that may be optimal throughout a runtime of such an IC device over real-world workloads, or capable of adjusting well to new unanticipated workloads postproduction. In other embodiments, an IC layout may be tailored to facilitate cooling based on a dynamic availability of a cooling resource (e.g., fans, air conditioning chillers) that affects operating costs.

According to an embodiment, process 400 may provide device layout and/or process steps for an IC design that are responsive to a dynamic availability of a cooling resource. Such capacity of such a cooling resource may be added or subtracted for a given workload run, for example. In an example implementation, a fan to blow air over a porous surface of an IC device (e.g., porous surfaces 330) may be modulated based upon internal thermal sensors disposed in the IC device. Internal to the IC device, heat exchange may be modulated by coolant flow rate adjustments, for example. Such coolant flow rate adjustments may be realized in different forms. If a coolant fluid is to be pumped through an IC device, pump pressure may be increased or lowered. Here, a system controlling the pump may be trained to take into account that increased turbulence of a fluid does not necessarily result in increased or more effective cooling. Also, baffles, valves and/or other constrictions or expansion chambers may be combined with cooling channels to restrict and/or enhance coolant flow locally, thereby allowing diversion of cooling flows to different portions of an IC device and/or enhancing cooling capacity. Such actuators may be implemented using a variety of different techniques including, for example, application of micromechanical fabrication techniques (e.g., MEMS) used in microfluidics or even micromachines such as steerable display mirrors (e.g., repurposed to act as baffles), for example. In a particular implementation, such techniques to control a dynamic availability of a cooling resource may be coordinated and/or controlled by a processor and/or microcontroller device, for example. Additionally, such an adaptive application and/or availability of a cooling resource may provide economic advantages for data centers, for example. It should be understood that these are merely example implementations of an adaptive cooling system, and claimed subject matter is not limit in this respect. Additionally, such dynamic control of a coolant may be provided as an adjunct to, rather than a replacement of, aforementioned passive and/or convective techniques.

According to an embodiment, one more aspects of process 400 may be performed by a computing device. Aspects of such a computing device are shown by example in FIG. 5 according to an embodiment. In particular implementations, example devices in FIG. 5 may comprise features, for example, of a client computing device and/or a server computing device, in an embodiment. It is further noted that the term computing device, in general, whether employed as a client and/or as a server, or otherwise, refers at least to a processor and a memory connected by a communication bus. A "processor," for example, is understood to connote a specific structure such as a central processing unit (CPU) of a computing device which may include a control unit and an execution unit. In an aspect, a processor may comprise a device that interprets and executes instructions to process input signals to provide output signals. As such, in the context of the present patent application at least, computing device and/or processor are understood to refer to sufficient structure within the meaning of 35 USC § 112 (f) so that it is specifically intended that 35 USC § 112 (f) not be implicated by use of the term "computing device" "processor" and/or similar terms; however, if it is determined, for some reason not immediately apparent, that the foregoing understanding cannot stand and that 35 USC § 112 (f), therefore, necessarily is implicated by the use of the term "computing device," "processor" and/or similar terms, then, it is intended, pursuant to that statutory section, that corresponding structure, material and/or acts for performing one or more operations and/or functions be understood and be interpreted to be described at least in FIG. 4 and in the text associated with the foregoing figure(s) of the present patent application.

Figure 5:
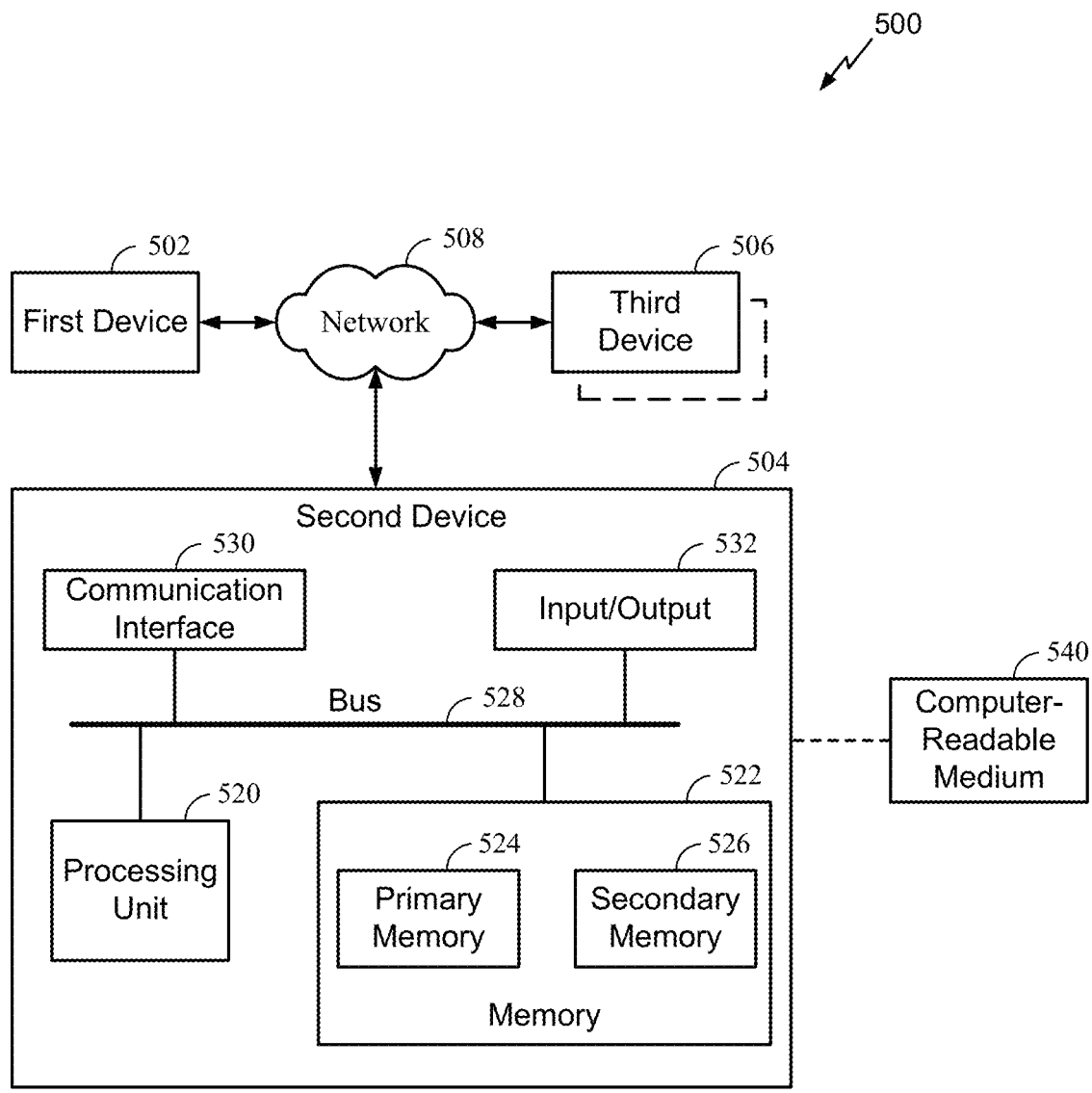
FIG. 5 is a schematic block diagram of an example computing system in accordance with an implementation.

In one example embodiment, as shown in FIG. 5, a system embodiment may comprise a local network (e.g., device 504 and medium 540) and/or another type of network, such as a computing and/or communications network. For purposes of illustration, therefore, FIG. 5 shows an embodiment 500 of a system that may be employed to implement either type or both types of networks. Network 508 may comprise one or more network connections, links, processes, services, applications, and/or resources to facilitate and/or support communications, such as an exchange of communication signals, for example, between a computing device, such as 502, and another computing device, such as 506, which may, for example, comprise one or more client computing devices and/or one or more server computing device. By way of example, but not limitation, network 508 may comprise wireless and/or wired communication links, telephone and/or telecommunications systems, Wi-Fi networks, Wi-MAX networks, the Internet, a local area network (LAN), a wide area network (WAN), or any combinations thereof.

In FIG. 5, computing device 502 may provide one or more sources of executable computer instructions in the form physical states and/or signals (e.g., stored in memory states), for example. Computing device 502 may communicate with computing device 504 by way of a network connection, such as via network 508, for example. As previously mentioned, a connection, while physical, may not necessarily be tangible. Although computing device 504 of FIG. 5 shows various tangible, physical components, claimed subject matter is not limited to a computing devices having only these tangible components as other implementations and/or embodiments may include alternative arrangements that may comprise additional tangible components or fewer tangible components, for example, that function differently while achieving similar results. Rather, examples are provided merely as illustrations. It is not intended that claimed subject matter be limited in scope to illustrative examples.

Memory 522 may comprise any non-transitory storage mechanism. Memory 522 may comprise, for example, primary memory 524 and secondary memory 526, additional memory circuits, mechanisms, or combinations thereof may be used. Memory 522 may comprise, for example, random access memory, read only memory, etc., such as in the form of one or more storage devices and/or systems, such as, for example, a disk drive including an optical disc drive, a tape drive, a solid-state memory drive, etc., just to name a few examples.

Memory 522 may be utilized to store a program of executable computer instructions. For example, processor 520 may fetch executable instructions from memory and proceed to execute the fetched instructions. Memory 522 may also comprise a memory controller for accessing device readable-medium 540 that may carry and/or make accessible digital content, which may include code, and/or instructions, for example, executable by processor 520 and/or some other device, such as a controller, as one example, capable of executing computer instructions, for example. Under direction of processor 520, a non-transitory memory, such as memory cells storing physical states (e.g., memory states), comprising, for example, a program of executable computer instructions, may be executed by processor 520 and able to generate signals to be communicated via a network, for example, as previously described. Generated signals may also be stored in memory, also previously suggested.

Memory 522 may store electronic files and/or electronic documents, such as relating to one or more users, and may also comprise a computer-readable medium that may carry and/or make accessible content, including code and/or instructions, for example, executable by processor 520 and/or some other device, such as a controller, as one example, capable of executing computer instructions, for example. As previously mentioned, the term electronic file and/or the term electronic document are used throughout this document to refer to a set of stored memory states and/or a set of physical signals associated in a manner so as to thereby form an electronic file and/or an electronic document. That is, it is not meant to implicitly reference a particular syntax, format and/or approach used, for example, with respect to a set of associated memory states and/or a set of associated physical signals. It is further noted an association of memory states, for example, may be in a logical sense and not necessarily in a tangible, physical sense. Thus, although signal and/or state components of an electronic file and/or electronic document, are to be associated logically, storage thereof, for example, may reside in one or more different places in a tangible, physical memory, in an embodiment.

Figure 6:
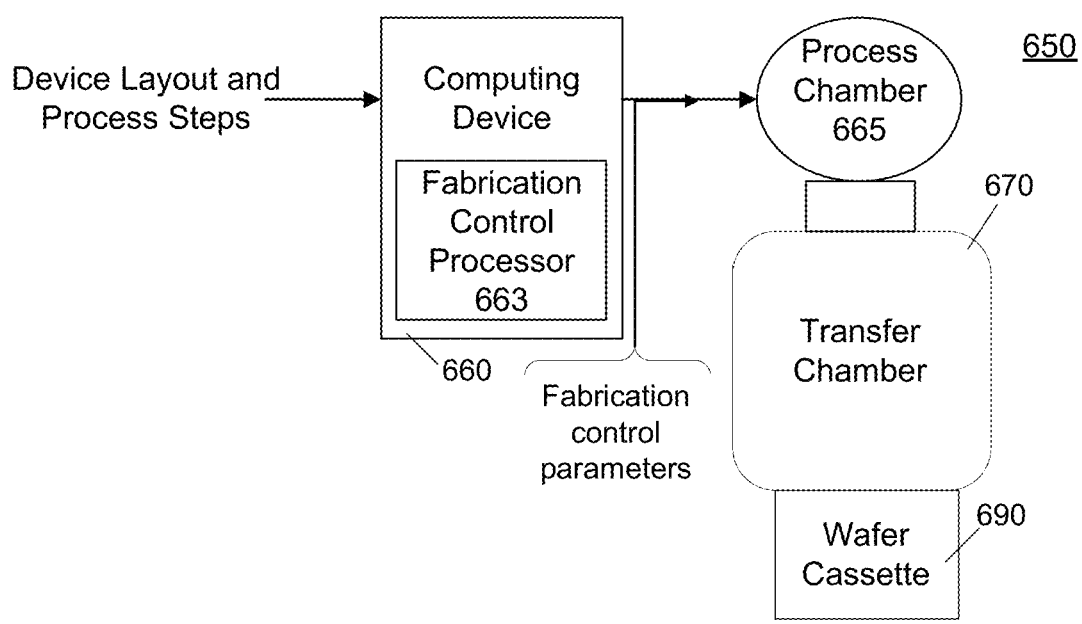
FIG. 6 is a schematic diagram of a system for manufacture of a device according to an embodiment.

FIG. 6 is a schematic of a system for forming three-dimensional circuit dies according to an embodiment 650. According to an embodiment, computing device 660 may determine fabrication control parameters based, at least in part, on particular device layout and process steps (e.g., device layout and process steps determined by block 408, FIG. 4). According to an embodiment, layers of material to form a three-dimensional IC die as illustrated in FIGS. 2A, 2B, 3A, 3B and 3C may be formed in process chamber 665 using any one of several suitable deposition processes such as, for example, atomic layer deposition, chemical vapor deposition, plasma chemical vapor deposition, sputter deposition, physical vapor deposition, hot wire chemical vapor deposition, laser enhanced chemical vapor deposition, laser enhanced atomic layer deposition, rapid thermal chemical vapor deposition, spin on deposition, gas cluster ion beam deposition, and/or the like, utilized in fabrication of three-dimensional IC dies from materials presently available and/or to be available in the future.

In embodiment 650, computing device 660 may generate particular device settings and other control parameters to be utilized by process chamber 665, transfer chamber 670, and wafer cassette 690 based, at least in part, on device layout and process steps (e.g., as determined by block 408, FIG. 4). For example, responsive to computing device 660 obtaining device layout and process steps, fabrication control processor 663 may operate to specify fabrication control parameters, such as particular materials including host materials and dopant precursors to be employed in deposition, chamber pressure, annealing temperatures, exposure durations, and a variety of additional settings utilized by process chamber 665, and claimed subject matter is not limited in this respect. In embodiments, after fabrication of one or more wafers comprising processor devices, storage devices and/or inter-device communication devices, process chamber may transport fabricated wafers to wafer cassette 690 for singulation and/or other postprocessing of wafers.

In an embodiment, computing device 660 may comprise a memory or storage device, which may include primary and secondary memories, which may communicate with control fabrication processor 663. Computing device 660 may utilize, for example, an internal bus structure.

Particular embodiments disclosed herein are directed to a computing rack, comprising: a three-dimensional structure to comprise a first surface adapted to face a mounting surface and a second surface opposite the first surface, wherein the three-dimensional structure further comprises two or more modular circuit boards disposed between the first and second surfaces, wherein: the three-dimensional structure further to comprise one or more cavities to extend between the first surface and the second surface to discharge heat from the second surface; and at least one of the one or more cavities further to extend through at least two of the two or more modular circuit boards. In one particular implementation, the computing rack may further comprise a cold reservoir disposed in contact with the mounting surface and/or first surface to enable active cooling of the three-dimensional structure, and wherein at least one of the one or more cavities to draw cooler air into the computing rack and discharge warmer air from the computing rack. In another particular implementation, the computing rack may further comprise one or more branch channels coupling at least one of the one or more cavities to a lateral surface of the three-dimensional structure. In one example, the one or more cavities and the one or more branch channels may be positioned to couple an airflow external to the three-dimensional structure and an expected airflow internal to the three-dimensional structure. In another example, the one or more cavities and the one or more branch channels may comprise features adapted to provide a resonance matched with the expected airflow. In yet another example, the one or more cavities and the one or more branch channels may create a pumping action and/or thermo siphon to remove heat from an interior of the three-dimensional structure. In another particular implementation, the computing rack may comprise exposed surfaces, the exposed surfaces to include exterior surfaces and one or more interior surfaces of the one or more cavities, and a plurality of functional devices, and wherein functional devices are placed in proximity to exposed surfaces based, at least in part, on heat to be generated by the functional devices. For example, the functional devices may comprise a combination of at least processing devices and memory devices. In another particular implementation, the computing rack may further comprise at least one external surface comprising a porous material to enable heat from one or more circuits formed on circuit boards disposed in the three-dimensional structure to be discharged therethrough. In another particular implementation, the computing rack may further comprise at least one active cooling element and at least one passive cooling element to facilitate discharge of heat from one or more circuits formed on modular circuit boards disposed within in the three-dimensional structure. For example, the at least one active cooling element may comprise one or more active baffles to modulate heat exchange.

In the preceding description, in a particular context of usage, such as a situation in which tangible components (and/or similarly, tangible materials) are being discussed, a distinction exists between being "on" and being "over." As an example, deposition of a substance "on" a substrate refers to a deposition involving direct physical and tangible contact without an intermediary, such as an intermediary substance (e.g., an intermediary substance formed during an intervening process operation), between the substance deposited and the substrate in this latter example; nonetheless, deposition "over" a substrate, while understood to potentially include deposition "on" a substrate (since being "on" may also accurately be described as being "over"), is understood to include a situation in which one or more intermediaries, such as one or more intermediary substances, are present between the substance deposited and the substrate so that the substance deposited is not necessarily in direct physical and tangible contact with the substrate.

A similar distinction is made in an appropriate particular context of usage, such as in which tangible materials and/or tangible components are discussed, between being "beneath" and being "under." While "beneath," in such a particular context of usage, is intended to necessarily imply physical and tangible contact (similar to "on," as just described), "under" potentially includes a situation in which there is direct physical and tangible contact but does not necessarily imply direct physical and tangible contact, such as if one or more intermediaries, such as one or more intermediary substances, are present. Thus, "on" is understood to mean "immediately over" and "beneath" is understood to mean "immediately under."

It is likewise appreciated that terms such as "over" and "under" are understood in a similar manner as the terms "up," "down," "top," "bottom," "upper," "lower," "lateral" and so on, previously mentioned. These terms may be used to facilitate discussion but are not intended to necessarily restrict scope of claimed subject matter. For example, the term "over," as an example, is not meant to suggest that claim scope is limited to only situations in which an embodiment is right side up, such as in comparison with the embodiment being upside down, for example. An example includes a flip chip, as one illustration, in which, for example, orientation at various times (e.g., during fabrication) may not necessarily correspond to orientation of a final product. Thus, if an object, as an example, is within applicable claim scope in a particular orientation, such as upside down, as one example, likewise, it is intended that the latter also be interpreted to be included within applicable claim scope in another orientation, such as right side up, again, as an example, and vice-versa, even if applicable literal claim language has the potential to be interpreted otherwise. Of course, again, as always has been the case in the specification of a patent application, particular context of description and/or usage provides helpful guidance regarding reasonable inferences to be drawn.

Unless otherwise indicated, in the context of the present disclosure, the term "or" if used to associate a list, such as A, B, or C, is intended to mean A, B, and C, here used in the inclusive sense, as well as A, B, or C, here used in the exclusive sense. With this understanding, "and" is used in the inclusive sense and intended to mean A, B, and C; whereas "and/or" can be used in an abundance of caution to make clear that all of the foregoing meanings are intended, although such usage is not required. In addition, the term "one or more" and/or similar terms is used to describe any feature, structure, characteristic, and/or the like in the singular, "and/or" is also used to describe a plurality and/or some other combination of features, structures, characteristics, and/or the like. Furthermore, the terms "first," "second," "third," and the like are used to distinguish different aspects, such as different components, as one example, rather than supplying a numerical limit or suggesting a particular order, unless expressly indicated otherwise. Likewise, the term "based on" and/or similar terms are understood as not necessarily intending to convey an exhaustive list of factors, but to allow for existence of additional factors not necessarily expressly described.

Furthermore, it is intended, for a situation that relates to implementation of claimed subject matter and is subject to testing, measurement, and/or specification regarding degree, to be understood in the following manner. As an example, in a given situation, assume a value of a physical property is to be measured. If alternatively reasonable approaches to testing, measurement, and/or specification regarding degree, at least with respect to the property, continuing with the example, is reasonably likely to occur to one of ordinary skill, at least for implementation purposes, claimed subject matter is intended to cover those alternatively reasonable approaches unless otherwise expressly indicated. As an example, if a plot of measurements over a region is produced and implementation of claimed subject matter refers to employing a measurement of slope over the region, but a variety of reasonable and alternative techniques to estimate the slope over that region exist, claimed subject matter is intended to cover those reasonable alternative techniques, even if those reasonable alternative techniques do not provide identical values, identical measurements or identical results, unless otherwise expressly indicated.

It is further noted that the terms "type" and/or "like," if used, such as with a feature, structure, characteristic, and/or the like, using "optical" or "electrical" as simple examples, means at least partially of and/or relating to the feature, structure, characteristic, and/or the like in such a way that presence of minor variations, even variations that might otherwise not be considered fully consistent with the feature, structure, characteristic, and/or the like, do not in general prevent the feature, structure, characteristic, and/or the like from being of a "type" and/or being "like," (such as being an "optical-type" or being "optical-like," for example) if the minor variations are sufficiently minor so that the feature, structure, characteristic, and/or the like would still be considered to be predominantly present with such variations also present. Thus, continuing with this example, the terms optical-type and/or optical-like properties are necessarily intended to include optical properties. Likewise, the terms electrical-type and/or electrical-like properties, as another example, are necessarily intended to include electrical properties. It should be noted that the specification of the present disclosure merely provides one or more illustrative examples and claimed subject matter is intended to not be limited to one or more illustrative examples; however, again, as has always been the case with respect to the specification of a patent application, particular context of description and/or usage provides helpful guidance regarding reasonable inferences to be drawn.

In the preceding description, various aspects of claimed subject matter have been described. For purposes of explanation, specifics, such as amounts, systems, and/or configurations, as examples, were set forth. In other instances, well-known features were omitted and/or simplified so as not to obscure claimed subject matter. While certain features have been illustrated and/or described herein, many modifications, substitutions, changes, and/or equivalents will occur to those skilled in the art. It is, therefore, to be understood that the appended claims are intended to cover all modifications and/or changes as fall within claimed subject matter.

What is claimed is:

1. An integrated circuit device comprising:
   a three-dimensional structure to comprise a first surface adapted to face a mounting surface and a second surface opposite the first surface, the three-dimensional structure further to comprise one or more cavities to extend between the first surface and the second surface to discharge heat from the second surface,
   wherein the first surface is adjacent to a gap connected to at least one of the one or more cavities so as to enable air to be drawn from the gap through the at least one of the one or more cavities to discharge from the second surface.

2. The integrated circuit device of claim 1, wherein the three-dimensional structure further comprises two or more circuit layers disposed between the first and second surfaces, and wherein at least one of the one or more cavities further to extend through at least two of the two or more circuit layers.

3. The integrated circuit device of claim 1, and further comprising a cold reservoir disposed in contact with the mounting surface and/or the first surface to enable active cooling of the three-dimensional structure, and wherein at least one of the one or more cavities to draw cooler air into the integrated circuit device and discharge warmer air from the integrated circuit device.

4. The integrated circuit device of claim 1, and further comprising one or more branch channels coupling at least one of the one or more cavities to a lateral surface of the three-dimensional structure.

5. The integrated circuit device of claim 4, wherein the one or more cavities and the one or more branch channels are positioned couple an airflow external to the three-dimensional structure and an expected airflow internal to the three-dimensional structure.

6. The integrated circuit device of claim 5, wherein the one or more cavities and the one or more branch channels comprise features adapted to provide a resonance matched with the expected airflow.

7. The integrated circuit device of claim 5, wherein the one or more cavities and the one or more branch channels to create a pumping action and/or thermo siphon to remove heat from an interior of the three-dimensional structure.

8. The integrated circuit device of claim 1, wherein the integrated circuit device comprises exposed surfaces, the exposed surfaces to include exterior surfaces and one or more interior surfaces of the one or more cavities, and a plurality of functional devices, and wherein functional devices are placed in proximity to the exposed surfaces based, at least in part, on heat to be generated by the functional devices.

9. The integrated circuit device of claim 8, wherein the functional devices comprise a combination of at least processing devices and memory devices.

10. The integrated circuit device of claim 1, and further comprising at least one external surface comprising a porous material to enable heat from one or more circuits formed in the three-dimensional structure to be discharged therethrough.

11. The integrated circuit device of claim 1, and further comprising at least one active cooling element and at least one passive cooling element to facilitate discharge of heat from one or more circuits formed in the three-dimensional structure.

12. The integrated circuit device of claim 11, wherein the at least one active cooling element comprises one or more active baffles to modulate heat exchange.

* * * * *